(12) United States Patent
Maeda et al.

(10) Patent No.: US 6,189,771 B1
(45) Date of Patent: Feb. 20, 2001

(54) METHOD OF FORMING SOLDER BUMP AND METHOD OF MOUNTING THE SAME

(75) Inventors: Tadashi Maeda; Tadahiko Sakai, both of Fukuoka (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/414,374

(22) Filed: Oct. 7, 1999

(30) Foreign Application Priority Data

Oct. 7, 1998 (JP) .................................................. 10-284922

(51) Int. Cl.⁷ .............................. B23K 31/00; H01L 21/44
(52) U.S. Cl. ........................ 228/248.1; 438/613; 438/614
(58) Field of Search ............................. 228/248.1, 248.5, 228/180.22, 254; 438/613, 614; 257/737, 738

(56) References Cited

U.S. PATENT DOCUMENTS 5,950,908 * 9/1999 Fujino et al. ...................... 228/248.1
5,973,406 * 10/1999 Harada et al. ......................... 257/780
6,132,543 * 10/2000 Mohri et al. ....................... 156/89.12

FOREIGN PATENT DOCUMENTS

2000114301 * 4/2000 (JP) .

* cited by examiner

*Primary Examiner*—Patrick Ryan
*Assistant Examiner*—Kiley Stoner
(74) *Attorney, Agent, or Firm*—Ratner & Prestia

(57) ABSTRACT

A solder bump formation method and solder bump mounting method for forming a solder bump by soldering a solder ball 9 onto an electrode 2 provided at the bottom of a cavity 3 on a substrate 2 which has an opening shape through which the solder ball 9 cannot go. Metal paste 5, containing metal having a higher liquidus temperature than that of solder used for the solder ball 9, is filled into the cavity 3. The solder ball 9 is placed on the cavity 3, and then heated to the temperature higher than the liquidus temperature of the solder ball 9. During the heating process, metal in the metal paste 5 remains unmelted in the cavity 3 when the solder ball 9 melts. This enables the metal to direct the melted solder to the electrode 2 at the bottom of the cavity 3, achieving good soldering.

16 Claims, 4 Drawing Sheets

METHOD OF FORMING SOLDER BUMP AND METHOD OF MOUNTING THE SAME

FIELD OF THE INVENTION

The present invention relates to the field of solder bump formation methods for forming solder bumps on electrodes in cavities created on workpieces, and solder bump mounting methods for soldering solder bumps onto electrodes in the cavities.

BACKGROUND OF THE INVENTION

The soldering of solder bumps, which are protruding solder electrodes provided on electronic components, onto their respective electrodes on a workpiece is commonly employed as a method for mounting electronic components. One common method for forming a solder bump is to place a solder ball on the electrode of an electronic component, and then to melt the solder ball by heating to solder it onto the receiving electrode.

In some types of electronic components, however, a solder bump is formed on a cavity provided on an insulation layer such as TAB (tape-automated bonding) tape overlaying the electrode, creating an electrical contact between the solder bump and the electrode at the bottom of the cavity. With the mounting density of electronic components continuing to increase, the alignment pitch of solder bumps is contracting. The diameter of the cavities is thus decreasing.

However, a solder ball for forming a solder bump needs to be larger than a certain size to secure the required solder volume. Accordingly, the diameter of the cavity is often smaller than the diameter of its corresponding solder ball for forming the solder bump. Since the solder ball cannot go through the opening of the cavity, the solder ball mounted on the cavity is caught by the opening. This may create a gap between the bottom face of the solder ball mounted on the cavity and the surface of the electrode at the bottom of the cavity.

When the solder ball is heated in the reflow process in this condition, the solder ball melts without contacting the electrode, and thus the solder ball and the electrode are not actually soldered. To prevent this defect, solder paste is conventionally provided inside the cavity. Solder paste contains solder particles suspended in flux. This conventional method aims to improve the solderability of the solder ball and electrode by providing solder particles in the cavity.

However, the solder particles in the solder paste employed in the conventional solder bump formation method have the same liquidus temperature as the solder ball, and thus, in the reflow process, the solder particles melts at the same time as the solder ball. The problem is that the larger volume of melted solder particles in the cavity is absorbed by the melted solder ball formed of melted solder ball. In other words, a large percentage of the solder particles provided in the cavity with the intention of providing an electrical connection between the solder ball and the electrode coalesced with the solder ball and is merely increasing the volume of the solder ball and failing to produce the intended effect.

Accordingly, the melted solder, which is a melted solder ball, still fails to contact the electrode in the cavity, and subsequently solidifies without contacting the electrode at the bottom of the cavity. In particular, if a solder bump is formed in a cavity having an opening shape through which the solder ball cannot go, defective solder bump formation often occurs even if solder paste is provided in the cavity.

The same problem also occurs when mounting spherical solder bumps on the circuit electrodes of a substrate. More specifically, the same problem occurs when a solder bump is soldered onto the electrode at the bottom of a cavity on the substrate which has an opening shape through which the solder bump cannot go.

The present invention provides a solder bump formation method and solder bump mounting method which prevent defective soldering.

SUMMARY OF THE INVENTION

A solder bump formation method of the present invention forms a solder bump on a cavity provided on a workpiece by soldering a solder ball onto an electrode at the bottom of the cavity. The present invention includes the steps of providing metal paste, containing metal having a higher liquidus temperature than that of solder used for the solder ball, between the solder ball and the electrode at the bottom of the cavity; placing the solder ball on the cavity; and soldering the solder ball onto the electrode by heating the workpiece to the temperature higher than the liquidus temperature of the solder ball.

The solder bump formation method of the present invention forms the solder bump on the cavity provided on the workpiece by soldering the solder ball onto an electrode at the bottom of the cavity. The present invention also includes the steps of providing metal paste, containing metal having a higher liquidus temperature than that of solder used for the solder ball, inside the cavity having an opening shape through which the solder ball cannot go; placing the solder ball on the cavity; and soldering the solder ball onto the electrode by heating the workpiece to the temperature higher than the liquidus temperature of the solder ball.

The solder bump formation method of the present invention forms the solder bump on the cavity provided on the workpiece by soldering the solder ball onto the electrode at the bottom of the cavity. The present invention furthermore includes the steps of attaching metal paste, containing metal having a higher liquidus temperature than that of solder used for the solder ball, to the solder ball; placing the solder ball onto which the metal paste is attached on the cavity having an opening shape through which the solder ball cannot go; and soldering the solder ball onto the electrode by heating the workpiece to the temperature higher than the liquidus temperature of the solder ball.

A solder bump mounting method of the present invention mounts a solder bump formed on an electronic component onto a workpiece by soldering the solder bump onto an electrode at the bottom of a cavity provided on the workpiece. The present invention includes the steps of providing metal paste, containing metal having a higher liquidus temperature than that of solder used for the solder bump, between the solder bump and the electrode at the bottom of the cavity; placing the solder bump on the cavity; and soldering the solder bump onto the electrode by heating the workpiece to the temperature higher than the liquidus temperature of the solder bump.

A solder bump mounting method of the present invention mounts a solder bump formed on an electronic component onto a workpiece by soldering the solder bump onto an electrode at the bottom of a cavity provided on the workpiece. The present invention also includes the steps of providing metal paste, containing metal having a higher liquidus temperature than that of solder used for the solder bump, inside the cavity having an opening shape through which the solder bump cannot go; placing the solder bump on the cavity; and soldering the solder bump onto the electrode by heating the workpiece to the temperature higher than the liquidus temperature of the solder bump.

The solder bump mounting method of the present invention mounts a solder bump formed on the electronic component onto the workpiece by soldering the solder bump onto an electrode at the bottom of the cavity provided on the workpiece. The present invention includes the steps of attaching metal paste, containing metal having a higher liquidus temperature than that of solder used for the solder bump, to the solder bump; placing the solder bump onto which the metal paste is attached on the cavity having an opening shape through which the solder bump cannot go; and soldering the solder bump onto the electrode by heating the workpiece to the temperature higher than the liquidus temperature of the solder bump.

The solder bump formation and solder bump mounting methods of the present invention employ a printing method using a stencil mask, a transfer method using a pin, or application method using a dispenser in the step of providing the metal paste inside the cavity.

The solder bump formation and solder bump mounting methods of the present invention further employs the metal paste containing one or more of tin, lead, zinc, gold, silver, copper, antimony, indium, and bismuth.

With the above configuration, the present invention achieves good soldering by providing metal paste, containing metal having a higher liquidus temperature than that of solder used for solder ball or solder bump, inside the cavity so that metal in the metal paste in the cavity, which remains unmelted when the solder ball or solder bump melts in the heating process, directs the melted solder to the electrode at the bottom of the cavity.

DESCRIPTION OF THE PREFERRED EMBODIMENT

First Exemplary Embodiment

FIGS. 1A to 1E, 2A, and 2B illustrate steps of a solder bump formation method in a first exemplary embodiment of the present invention. In the first exemplary embodiment, a solder bump is formed on a cavity by soldering a solder ball onto an electrode at the bottom of the cavity provided on a workpiece.

Figure 1A:
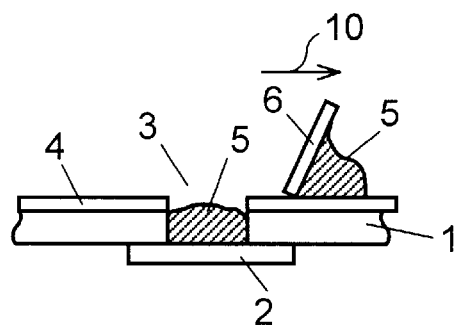
FIGS. 1A to 1E illustrate the steps of a solder bump formation method in accordance with a first exemplary embodiment of the present invention.

In FIG. 1A, a cavity 3 is formed on a substrate 1, which is the workpiece, and an electrode 2 disposed on the bottom face of the substrate 1 is exposed at the bottom of the cavity 3. A stencil mask 4 is placed on the substrate 1, and metal paste 5 is filled into the cavity 3 by horizontally moving the metal paste 5 in the direction of an arrow 10 on the stencil mask 4 using a squeegee 6.

The metal paste 5 is explained next. The metal paste 5 is made by mixing metal with flux. This metal mixture contains one or more of tin, lead, zinc, gold, silver, copper, antimony, indium, and bismuth. The liquidus temperature of the metal or alloy contained in the flux is higher than that (183° C. in the first exemplary embodiment) of the solder used for the solder ball placed on the cavity 3 in the following steps described later.

The cavity 3 has a smaller diameter than that of the solder ball 9. In other words, an opening of the cavity 3 has a shape (size) through which the solder ball 9 cannot go.

Figure 1B:
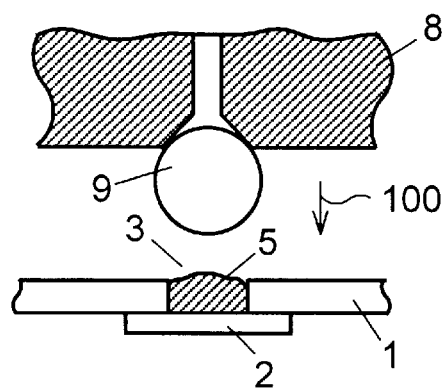
Figure 1C:
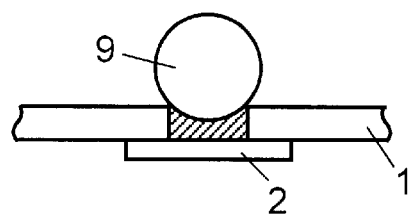
Figure 1D:
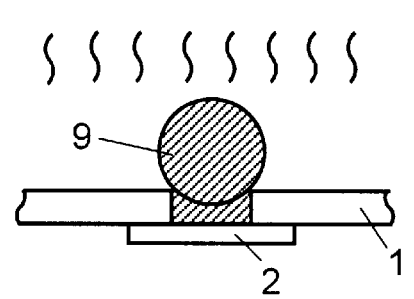

Next, the solder ball 9 is disposed on the cavity 3 into which the metal paste 5 is filled. As shown in FIG. 1B, the solder ball 9 is picked up by a suction tool 8 and moved over the substrate 1. The solder ball 9 is then positioned over the cavity 3 and lowered in the direction of an arrow 100. FIG. 1C shows the state of the solder ball 9 placed on the cavity 3 in which the metal paste 5 is filled. The substrate 1 with the solder ball 9 is then fed to the reflow process, and heated to 183° C. or above, which is the liquidus temperature of the solder ball 9, as shown in FIG. 1D.

Figure 1E:
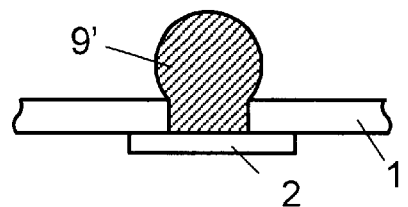

In the reflow process, the solder ball 9 melts but metal in the metal paste 5 does not melt because this metal has a higher liquidus temperature than that of the solder ball 9. Accordingly, the melted solder of the solder ball 9 wets the metal particles in the metal paste 5 inside the cavity 3, and the melted solder of the solder ball 9 is then led to the surface of the electrode 2 by the metal particles, ensuring successful soldering onto the electrode 2. Under these conditions, a gap in the cavity 3 caused by separation of the metal paste 5 from the surface of the electrode 2 due to the integration of the metal in the cavity 3 only with melted solder of the solder ball 9 does not occur. After the melted solder solidifies, a solder bump 9' which shows good bonding and electrical connection onto the electrode 2 is formed, as shown in FIG. 1E.

Metal in the metal paste 5 has a higher liquidus temperature than 183° C. which is the liquidus temperature of the solder ball 9. For example, if metal in the metal paste 5 consists of 3.5 wt. % of silver and 96.5 wt. % of tin, its liquidus temperature is 220° C., which is 37° C. higher than the liquidus temperature of the solder ball 9. In this case, the melted solder of the solder ball 9 has wetted the metal particles in the metal paste 5, and has been led by the metal particles to the surface of the electrode 2 without fail, resulting in good soldering with the electrode 2. The liquidus temperature of metal in the metal paste 5 is preferably not close to the liquidus temperature of the solder ball 9. For example, good results were obtained when it was 20° C. higher than the liquidus temperature of the solder ball 9.

A printing method for providing the metal paste 5 into the cavity 3 employing a stencil mask 4 is illustrated in FIGS. 1A to 1E. It is apparent that other methods are applicable. For example, a dispenser may be employed to inject the metal paste 5 into the cavity 3, or a transfer pin may be employed to transfer the metal paste 5 into the cavity 3.

Figure 2A:
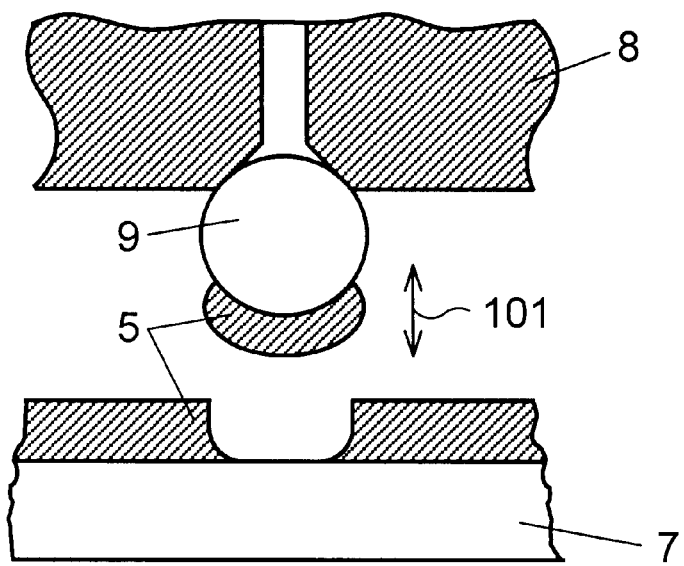
FIGS. 2A and 2B illustrate the steps of the solder bump formation method in accordance with the first exemplary embodiment of the present invention.
Figure 2B:
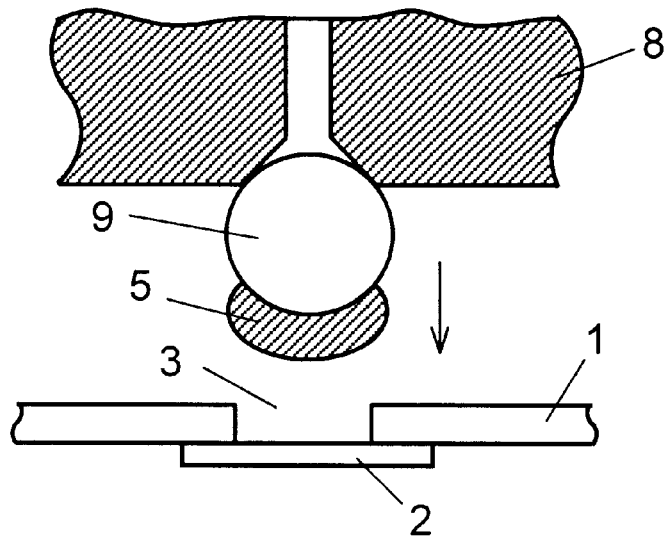

Furthermore, as shown in FIGS. 2A and 2B, the metal paste 5 may be attached to the solder ball 9 in advance, following which the solder ball 9 may be placed in the cavity 3 with the side on which the metal paste 5 is attached facing the cavity 3. In this method, as shown in FIG. 2A, the metal paste 5 can be attached to the bottom-facing part of the solder ball 9 by moving the suction tool 8 carrying the solder ball 9 vertically in the direction of an arrow 101 onto a paste applicator 7 spread with the metal paste 5. Then, as shown in FIG. 2B, the solder ball 9 onto which the metal paste 5 is attached is placed on the cavity 3 of the substrate 1. The remaining steps are the same as those after FIG. 1C.

As described above, the first exemplary embodiment has a feature to place the metal paste, containing metal having a higher liquidus temperature than that of the solder used for the solder ball, between the solder ball and the electrode at the bottom of the cavity. As a result, metal in the metal paste remains unmelted inside the cavity while the solder ball or solder bump melts during the heating process. This enables the metal to direct the melted solder to the electrode at the bottom of the cavity, thus achieving good soldering.

Second Exemplary Embodiment

FIGS. 3A to 3E, 4A, and 4B illustrate steps of a solder bump mounting method in a second exemplary embodiment of the present invention. In the second exemplary embodiment, a solder bump formed on an electronic component is soldered onto an electrode at the bottom of a cavity provided on a workpiece.

Figure 3A:
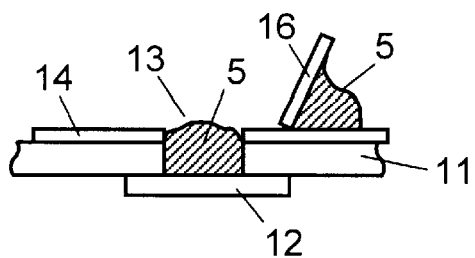
FIGS. 3A to 3E illustrate the steps of a solder bump mounting method in accordance with a second exemplary embodiment of the present invention.

In FIG. 3A, a cavity 13 is formed on a substrate 11, which is a workpiece, and an electrode 12 disposed on the bottom face of the substrate 11 is exposed at the bottom of the cavity 13. The metal paste 5 is filled into the cavity 13 of the substrate 11 using a stencil mask 14 and squeegee 16 in the same way as that described in the first exemplary embodiment.

Figure 3B:
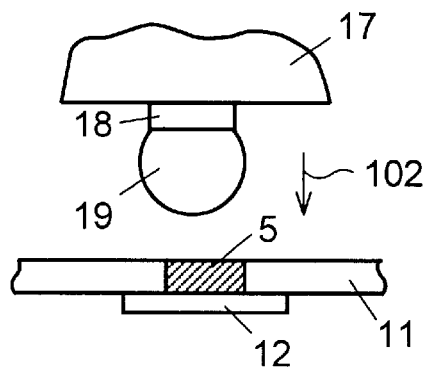
Figure 3C:
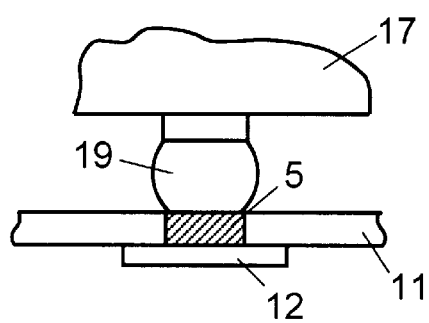
Figure 3D:
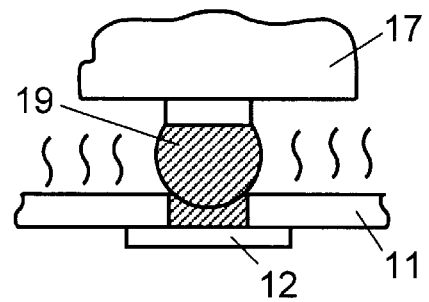
Figure 3E:
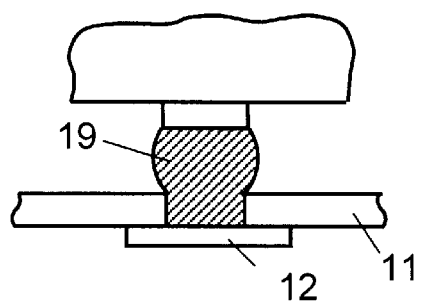

Next, as shown in FIG. 3B, a solder bump 19 formed on an electrode 18 of an electronic component 17 is placed above the cavity 13 in which the metal paste 5 is filled. A holding head (not illustrated) holding the electronic component 17 lowers the solder bump 19 to the cavity 13 in the direction shown by an arrow 102. FIG. 3C illustrates the state of the solder bump 19 placed on the cavity 13. The substrate 11 is then fed to the reflow process, and heated to 183° C., the liquidus temperature of the solder bump 19, or above as shown in FIG. 3D. Melted solder bump 19 is soldered onto the electrode 12 in the reflow process, as shown in FIG. 3E, and is mounted onto the substrate 11. Soldering takes place in the same way as that in the first exemplary embodiment.

Also in the second exemplary embodiment, the liquidus temperature of the metal or alloy in the flux is higher than that (183° C. in this embodiment) of the solder used for the solder ball.

The cavity 13 has a smaller diameter than that of the solder bump 19. In other words, an opening of the cavity 13 has a shape (size) through which the solder bump 19 cannot go.

Figure 4A:
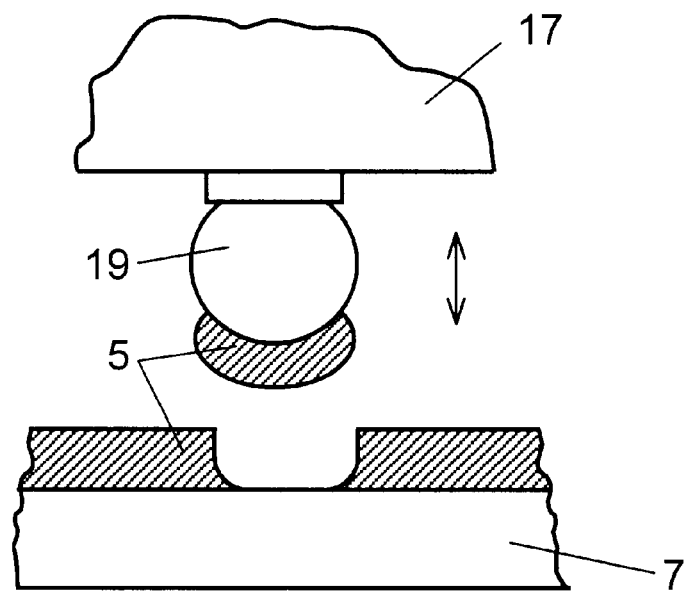
FIGS. 4A and 4B illustrate the solder bump mounting method in accordance with the second exemplary embodiment of the present invention.
Figure 4B:
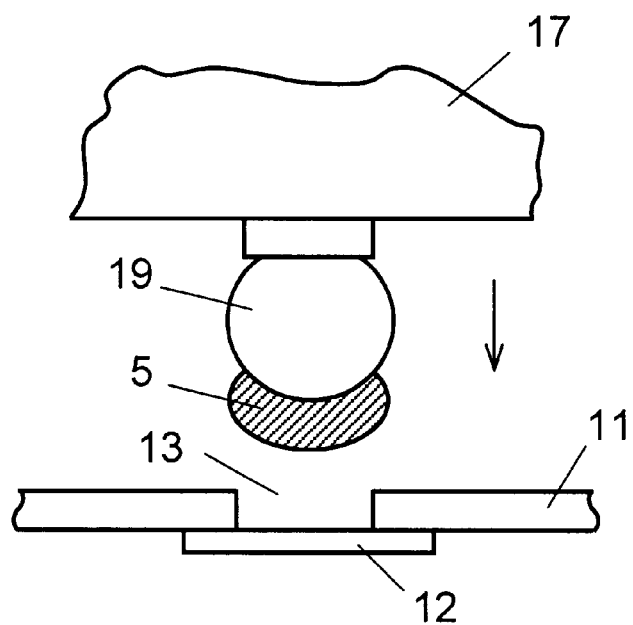

As a method for filling the metal paste 5 into the cavity 13, a dispenser may also be employed to inject the metal paste 5 into the cavity 13, or a transfer pin may also be employed to transfer the metal paste 5 into the cavity 13. Furthermore, as shown in FIGS. 4A and 4B, the metal paste 5 may be attached to the solder bump 19 in advance, following which the solder bump 19 may be placed on the cavity 13 in the same way as that in the first exemplary embodiment.

As described above, the present invention fills metal paste, containing metal having a higher liquidus temperature than that of the solder used for the solder ball or solder bump, into the cavity. As a result, metal in the metal paste remains unmelted inside the cavity while the solder ball or solder bump melts during the heating process. This enables the metal to direct the melted solder to the electrode at the bottom of the cavity, thus achieving good soldering.

What is claimed is:

1. A solder bump formation method in which a solder bump is formed on a cavity provided on a workpiece by soldering a solder ball onto an electrode at the bottom of said cavity; and said method comprising the steps of:

providing metal paste, containing metal having a higher liquidus temperature than that of solder used for said solder ball, between said solder ball and said electrode at the bottom of said cavity;

placing said solder ball on said cavity; and soldering said solder ball onto said electrode by heating to a temperature higher than the liquidus temperature of said solder ball.

2. The solder bump formation method as defined in claim 1, wherein said metal paste contains one of tin, lead, zinc, gold, silver, copper, antimony, indium, and bismuth.

3. A solder bump formation method in which a solder bump is formed on a cavity provided on a workpiece by soldering a solder ball onto an electrode at the bottom of said cavity; and said method comprising the steps of:

providing metal paste, containing metal having a higher liquidus temperature than that of solder used for said solder ball, inside said cavity having an opening shape through which said solder ball cannot go;

placing said solder ball on said cavity; and soldering said solder ball onto said electrode by heating to a temperature higher than the liquidus temperature of said solder ball.

4. The solder bump formation method as defined in claim 3, wherein said metal paste contains one of tin, lead, zinc, gold, silver, copper, antimony, indium, and bismuth.

5. The solder bump formation method as defined in claim 3, wherein said step of providing metal paste inside said cavity employs one of methods of:

printing said metal paste using a stencil mask;

transferring said metal paste using a pin; and applying said metal paste using a dispenser.

6. The solder bump formation method as defined in claim 5, wherein said metal paste contains one of tin, lead, zinc, gold, silver, copper, antimony, indium, and bismuth.

7. A solder bump formation method in which a solder bump is formed on a cavity provided on a workpiece by soldering a solder ball onto an electrode at the bottom of said cavity; and said method comprising the steps of:

attaching metal paste, containing metal having a higher liquidus temperature than that of solder used for said solder ball, to said solder ball;

placing said solder ball on said cavity having an opening shape through which said solder ball cannot go, with the side on which said metal paste is attached facing said cavity; and soldering said solder ball onto said electrode by heating to a temperature higher than the liquidus temperature of said solder ball.

8. The solder bump formation method as defined in claim 7, wherein said metal paste contains one of tin, lead, zinc, gold, silver, copper, antimony, indium, and bismuth.

9. A solder bump mounting method in which a solder bump formed on an electronic component is mounted onto a workpiece by soldering said solder bump onto an electrode at the bottom of a cavity provided on said workpiece, and said method comprising the steps of:

providing metal paste, containing metal having a higher liquidus temperature than that of solder used for said solder bump, between said solder bump and said electrode at the bottom of said cavity;

placing said solder bump on said cavity; and soldering said solder bump onto said electrode by heating to a temperature higher than the liquidus temperature of said solder bump.

10. The solder bump mounting method as defined in claim 9, wherein said metal paste contains at least one of tin, lead, zinc, gold, silver, copper, antimony, indium, and bismuth.

11. A solder bump mounting method in which a solder bump formed on an electronic component is mounted onto a workpiece by soldering said solder bump onto an electrode at the bottom of a cavity provided on said workpiece, and said method comprising the steps of:

providing metal paste, containing metal having a higher liquidus temperature than that of solder used for said solder bump, inside said cavity having an opening shape through which said solder bump cannot go;

placing said solder bump on said cavity; and soldering said solder bump onto said electrode by heating to a temperature higher than the liquidus temperature of said solder bump.

12. The solder bump mounting method as defined in claim 11, wherein said metal paste contains at least one of tin, lead, zinc, gold, silver, copper, antimony, indium, and bismuth.

13. The solder bump mounting method as defined in claim 11, wherein said step of providing metal paste inside said cavity employs one of methods of:

printing said metal paste using a stencil mask;

transferring said metal paste using a pin; and applying said metal paste using a dispenser.

14. The solder bump mounting method as defined in claim 13, wherein said metal paste contains at least one of tin, lead, zinc, gold, silver, copper, antimony, indium, and bismuth.

15. A solder bump mounting method in which a solder bump formed on an electronic component is mounted onto a workpiece by soldering said solder bump onto an electrode at the bottom of a cavity provided on said workpiece, and said method comprising the steps of:

attaching metal paste, containing metal having a higher liquidus temperature than that of solder used for said solder bump, to said solder bump;

placing said solder bump on said cavity having an opening shape through which said solder bump cannot go, with the side on which said metal paste is attached facing said cavity; and soldering said solder bump onto said electrode by heating to a temperature higher than the liquidus temperature of said solder bump.

16. The solder bump mounting method as defined in claim 15, wherein said metal paste contains at least one of tin, lead, zinc, gold, silver, copper, antimony, indium, and bismuth.

* * * * *